(12) United States Patent
Vanderberg et al.

(10) Patent No.: US 7,800,083 B2
(45) Date of Patent: Sep. 21, 2010

(54) PLASMA ELECTRON FLOOD FOR ION BEAM IMPLANTER

(75) Inventors: Bo H. Vanderberg, Gloucester, MA (US); William F. DiVergilio, Brookline, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 229 days.

(21) Appl. No.: 11/935,738

(22) Filed: Nov. 6, 2007

(65) Prior Publication Data

US 2009/0114815 A1  May 7, 2009

(51) Int. Cl.
*G21G 1/10* (2006.01)

(52) U.S. Cl. ............. 250/492.21; 250/251; 250/423 R; 250/492.2

(58) Field of Classification Search ................ 250/251, 250/423 R, 424, 427, 492.1, 492.2, 492.21, 250/492.22, 492.3
See application file for complete search history.

(56) References Cited

U.S. PATENT DOCUMENTS

| 4,463,255 | A | * | 7/1984 | Robertson et al. | ............ 250/251 |
| 4,595,837 | A | * | 6/1986 | Wu et al. | ................. 250/492.2 |
| 4,661,712 | A | | 4/1987 | Mobley | |
| 4,862,032 | A | * | 8/1989 | Kaufman et al. | ......... 313/359.1 |
| 5,148,034 | A | * | 9/1992 | Koike | ...................... 250/492.2 |
| 5,554,854 | A | | 9/1996 | Blake | |
| 5,691,537 | A | * | 11/1997 | Chen et al. | ................... 250/251 |
| 5,703,375 | A | * | 12/1997 | Chen et al. | ............. 250/492.21 |
| 6,271,529 | B1 | * | 8/2001 | Farley et al. | ........... 250/492.21 |
| 6,313,428 | B1 | * | 11/2001 | Chen et al. | ............. 219/121.43 |
| 6,476,399 | B1 | * | 11/2002 | Harrington et al. | ..... 250/492.21 |
| 6,815,697 | B2 | * | 11/2004 | Sano et al. | ............. 250/492.21 |
| 6,891,174 | B2 | * | 5/2005 | Wenzel et al. | .......... 250/492.21 |
| 7,227,160 | B1 | | 6/2007 | Vanderberg et al. | |
| 2003/0183780 | A1 | * | 10/2003 | Sano et al. | ............. 250/492.21 |
| 2006/0113492 | A1 | | 6/2006 | Kawaguchi et al. | |
| 2006/0169912 | A1 | * | 8/2006 | Renau et al. | .......... 250/396 ML |

FOREIGN PATENT DOCUMENTS

EP  291279 A1 * 11/1988

* cited by examiner

*Primary Examiner*—Jack I Berman
*Assistant Examiner*—Michael Maskell
(74) *Attorney, Agent, or Firm*—Eschweiler & Associates, LLC

(57) ABSTRACT

A plasma electron flood system, comprising a housing configured to contain a gas, and comprising an elongated extraction slit, and a cathode and a plurality of anodes residing therein and wherein the elongated extraction slit is in direct communication with an ion implanter, wherein the cathode emits electrons that are drawn to the plurality of anodes through a potential difference therebetween, wherein the electrons are released through the elongated extraction slit as an electron band for use in neutralizing a ribbon ion beam traveling within the ion implanter.

12 Claims, 10 Drawing Sheets

US 7,800,083 B2

PLASMA ELECTRON FLOOD FOR ION BEAM IMPLANTER

FIELD OF THE INVENTION

The present invention relates generally to ion implantation systems, and more particularly to uniform charge neutralization of an ion beam utilized in ion implantation systems.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam of desired energy. The ion beam is then directed at the surface of a semiconductor workpiece in order to implant the workpiece with the dopant element. The ions of the beam penetrate the surface of the workpiece to form a region of desired conductivity, such as in the fabrication of transistor devices in the workpiece or wafer. The implantation process is typically performed in a high vacuum process chamber which prevents dispersion of the ion beam by collisions with residual gas molecules and which minimizes the risk of contamination of the workpiece by airborne particles. A typical ion implanter includes an ion source for generating the ion beam, a beamline system including mass analysis apparatus for mass resolving the ion beam using magnetic fields, and a target chamber containing the semiconductor workpiece to be implanted by the ion beam. For high energy implantation systems, an acceleration apparatus is provided between the mass analysis magnet and the target chamber for accelerating the ions to high energies.

In order to achieve a desired ion implantation for a given application, the dosage and energy of the implanted ions may be varied. The ion dosage delivered controls the concentration of implanted ions for a given semiconductor material. Typically, high current implanters are used for high dose implants, while medium current implanters are used for lower dosage applications. The ion energy is used to control junction depth in semiconductor devices, where the energy levels of the beam ions determine the degree of depth of the implanted ions. The continuing trend toward smaller and smaller semiconductor devices requires a beamline construction which serves to deliver high beam currents at low energies. The high beam current provides the necessary dosage levels, while the low energy permits shallow implants. In addition, the continuing trend toward higher device densities on a semiconductor workpiece requires careful control over the uniformity of implantation beams being scanned across the workpiece.

One effect during ion implantation of a semiconductor wafer with electrodes insulated by a gate oxide from the bulk semiconductor is the charging of the insulated feature by the charge of the beam ions. This effect, commonly referred to as charging, can be detrimental to the semiconductor circuit if the voltages of the insulated feature (e.g. the gate electrode) exceed the breakdown voltage of the insulator (e.g. the gate oxide) such that resultant damage to the gate oxide occurs. It can be appreciated that the charging rate and voltage increase with beam current, and that ion implantation with ever increasing beam currents represents an increasing processing challenge.

To counteract the charging problem, the charging of the ion beam can be compensated for by providing electric charge of the opposite sign to the workpiece to be implanted. For a positive ion beam it is common practice to provide electrons in an amount equal to the amount of ions per unit time to the workpiece, i.e., to match the ion beam current with an equal electron current to the workpiece. This is typically brought about by devices generating electrons via electron generating processes such as thermionic emission, secondary emission, or discharge, and directing the electrons directly to the workpiece. These devices are typically designated electron guns, secondary electron flood, plasma electron flood, etc.

Another continuing trend is toward larger semiconductor workpiece sizes, such as 300 mm diameter wafers. Coupled with higher device densities, the larger workpiece size increases the cost of individual workpieces. As a result, control over implantation uniformity with respect to ion beams and other parameters is more critical than ever in avoiding or mitigating the cost associated with scrapping workpieces. The ion beam is shaped according to the ion source extraction opening and subsequent shaping apparatus, comprising, for example, mass analyzers, resolving apertures, quadrupole magnets, and ion accelerators, by which an ion beam is provided to target workpieces or wafers. The beam and/or the target workpiece are translated with respect to one another to effect the ion beam scanning of the workpiece.

Another technique used to limit beam blow-up in an ion beam is uniform charge neutralization utilizing electrons released into the ion beam. As for charge reduction, an electron discharge device typically involves making electrons utilizing ionization processes, energizing those electrons and colliding them with a gas. The energization can be done with a DC electric field (e.g., for a DC arc discharge) or a time varying electric field (e.g., for an AC arc discharge, an RF discharge, a microwave discharge, etc.). The type of discharge used is often based on the electrical characteristics that are desired (e.g., density distribution, densities achieved, etc.). Furthermore, microwave and RF discharges (e.g., RF plasma electron flood) can be scaled to large volumes but are more complicated and expensive to try to sustain, requiring matching circuits and costly high-frequency power generation.

FIGS. 1-3, 4A, 4B, and 5-7 illustrate a prior art wafer charge compensation device described in U.S. Published Patent 2006/0113492. In this example, this prior art device is applied particularly to a single-wafer ion implantation system among beam processing systems each using a charged particle beam. FIGS. 1 and 2 are a plan view and a side view, respectively, showing a schematic structure of the single-wafer ion implantation system.

The illustrated prior art ion implantation system comprises an ion source unit 11 (including ion source and extraction electrode), a mass analysis magnet device 12, a beam shaper 13, a deflector 14 for scanning, a P (i.e., parallelizing) lens 15, acceleration/deceleration electrodes 16, a deflecting energy filter 17, and a process chamber 18.

In this prior art ion implantation system, ions generated in the ion source unit 11 are extracted through the extraction electrode (not illustrated) as an ion beam (hereinafter referred to as a "beam"). The extracted beam is subjected to a mass analysis in the mass analysis magnet device 12 so that only a necessary ion species is selected for implantation. The beam composed of only the necessary ion species is shaped in cross-section by the beam shaper 13. The beam shaper 13 is formed by a Q (quadrant or quadrupole) lens and so on. The beam having the shaped cross-section is deflected in an upward/downward direction in FIG. 1 by the deflector 14 for scanning. The deflector 14 has at least one shield upstream electrode 14-1 and at least one downstream shield electrode 14-2 that are disposed near the deflector 14 on its upstream and downstream sides, respectively. Although deflection scan electrodes are used as the deflector 14 for scanning in this embodiment, a deflection scan magnet may be used in place of them.

The beam deflected by the deflector 14 for scanning is parallelized by the P-lens 15 formed by electrodes or a magnet so as to be parallel to an axis of a deflection angle of 0 degrees. In FIG. 1, a scan range by a reciprocal swinging beam by the deflector 14 is indicated by a thick black line and double broken lines. The beam from the P-lens 15 is accelerated or decelerated by one or more acceleration/deceleration electrodes 16 and sent to the deflecting energy filter 17. The deflecting energy filter 17 performs an energy analysis of the beam to thereby select only an ion species having a necessary energy. As shown in FIG. 2, only the selected ion species is deflected slightly downward in the deflecting energy filter 17. The beam composed of only the selected ion species is implanted into a wafer 19 that is a to-be-irradiated object introduced in the process chamber 18. The beam that is deviated from the workpiece 19 is incident on a beam stopper 18-1 provided in the process chamber 18 so that energy thereof is consumed. A transportation path of the beam is all maintained in a high-vacuum state.

In FIG. 1, arrows shown adjacent to the wafer 19 represent that the beam is deflected for scanning in directions of these arrows, while, in FIG. 2, arrows shown adjacent to the wafer 19 represent that the wafer 19 is moved in directions of these arrows. Specifically, assuming that the beam is reciprocatingly deflected for scanning in, for example, x-axis directions, the wafer 19 is driven by a drive mechanism (not illustrated) so as to be reciprocated in y-axis directions perpendicular to the x-axis directions. This enables irradiation with the beam over the whole surface of the wafer 19.

In the manner as described above, in the prior art ion implantation system shown in FIGS. 1 and 2, a beam having an elliptical or oval continuous cross-section that is long in one direction can be obtained by deflection a beam having a circular cross-section or an elliptical or oval cross-section and then bent at a uniform angle at any positions in a scan area thereof by the use of the deflecting energy filter serving as a later-stage energy analyzer and finally can be implanted into the wafer 19.

A charge compensation device 30 according to this prior art is provided on the downstream side of the deflector 14 and, more specifically, on the downstream side of the deflecting energy filter 17. The charge compensation device is also called a plasma shower. The charge compensation device 30 is located outside the process chamber 18 in FIGS. 1 and 2 but may be disposed inside the process chamber 18.

Referring to prior art FIGS. 3, 4A and 4B, a prior art ion source or charge compensation device 30 will be described. The prior art charge compensation device 30 comprises a first arc chamber 34 provided with a filament 31, a gas introduction port 32, and one or more first extraction holes 33, and a second arc chamber 35. The second arc chamber 35 has a second extraction hole 36 and is attached to a tubular or hollow cylindrical or rectangular member (flood box) 40 such that the second extraction hole 36 is exposed to an inner space 50 of the hollow cylindrical or rectangular member 40 and is faced on the reciprocal swinging beam of the scan area. The hollow cylindrical or rectangular member 40 may be part of a process chamber (not shown) on its inlet side or may be disposed in the process chamber. In any event, the second arc chamber 35 has a length approximately extending over the whole width of the hollow cylindrical or rectangular member 40.

In FIG. 5, symbol SA denotes a scan range or area 50 (deflecting range or area) by the beam in the hollow cylindrical or rectangular member 40. In this embodiment, the second extraction hole 36 is realized by a plurality of holes 36 arranged at intervals in a direction of the length of the second arc chamber 35 in the scan area SA.

Alternatively, the second extraction hole 36 may be realized by a single slit extending over the scan area SA. In the case of either the plurality of holes or the single silt, the opening distribution or shape of the second extraction hole 36 is configured to correspond to a second plasma density distribution in the second arc chamber 35. That is, it is desirable that the opening density be high at a portion where the plasma density is low while the opening density is low at a portion where the plasma density is high. Specifically, when the second extraction hole 36 is realized by the plurality of holes, the interval of the holes is shortened at the portion where the plasma density is low while the interval of the holes is increased at the portion where the plasma density is high. On the other hand, when the second extraction hole 36 is realized by the single slit, the width of the slit is increased at the portion where the plasma density is low while the width of the slit is reduced at the portion where the plasma density is high.

The first arc chamber 34 is attached to a wall of the second arc chamber 35 such that the first extraction hole 33 is exposed or opened up to the second arc chamber 35 at a position near an intermediate portion in the length direction of the second arc chamber 35. At a boundary portion between the first and second arc chambers 34 and 35, there is provided a first extraction electrode 37 having a hole at a position corresponding to the first extraction hole 33. However, the first extraction electrode 37 may be omitted. In this case, a second arc voltage, which will be described later, is supplied between the first and second arc chambers 34 and 35 for producing second plasma in the second arc chamber 35.

A plurality of permanent magnets 38 are disposed at wall surfaces of the second arc chamber 35 excluding those regions where the first arc chamber 34 and the second extraction hole 36 are respectively provided. That is, the permanent magnets 38 are arranged at intervals at each of the upper and lower wall surfaces, the left and right wall surfaces, and the both-side end wall surfaces of the second arc chamber 35. The permanent magnets 38 serve to form confinement magnetic fields (cusp magnetic fields for confinement) in the second arc chamber 35. Therefore, all the permanent magnets 38 are disposed with their magnetic poles directed toward the inside of the second arc chamber 35 and with the magnetic poles of the adjacent permanent magnets 38 being opposite to each other. In FIG. 5, magnetic fluxes forming the confinement magnetic fields are partly shown by arrows.

FIGS. 6 and 7 show an arrangement of the permanent magnets 38 at one of the both-side end wall surfaces of the second arc chamber 35. Herein, since the shape of the end wall surface is square, a plurality of square frame-shaped permanent magnets 38 having different sizes are disposed concentrically and a square permanent magnet 38 is disposed in the innermost-side frame-shaped permanent magnet 38. These permanent magnets 38 are also disposed with their magnetic poles directed toward the inside of the second arc chamber 35 and with the magnetic poles of the adjacent permanent magnets 38 being opposite to each other. The permanent magnet 38 may have another polygonal shape including a triangular shape. If the shape of the end wall surface is circular, the permanent magnet 38 may have an annular shape.

Note that the first and second arc chambers 34 and 35 are supported by an arc chamber support 39 (FIG. 3). The power is supplied to the filament 31 through a filament feed 41 attached to the arc chamber support 39. In FIGS. 1 and 2, the charge compensation device 30 is disposed at a position where the beam is deflected slightly downward. On the other hand, in FIG. 5, the hollow cylindrical or rectangular member 40 is illustrated in the horizontal state. In order to dispose the charge compensation device 30 as shown in FIGS. 1 and 2, the whole device is inclined so as to match a deflection angle of the beam.

A gas such as Argon is introduced into the first arc chamber 34 through the gas introduction port 32. A power is supplied from a filament power supply 42 to the filament 31 disposed in the first arc chamber 34 to heat the filament 31 to a high temperature to thereby generate electrons via thermionic emission. The thermionically emitted electrons are accelerated by a first arc voltage supplied between the filament 31 and the first arc chamber 34 from a first arc power supply 43. The accelerated electrons collide with the introduced gas so that the first plasma is produced in the first arc chamber 34. The first arc chamber 34 is provided with one or more first extraction holes 33 and the first extraction electrode 37 is disposed on the outside thereof. By supplying a first extraction voltage between the first extraction electrode 37 and the first arc chamber 34 from a first extraction power supply 44, first electrons are extracted from the first arc chamber 34.

The second arc chamber 35 having the length corresponding to the scan area SA is introduced with a neutral gas ejected from the first extraction hole 33 without ionization in the first arc chamber 34 and with the first electrons extracted from the first arc chamber 34. Even if a material of the filament 31 should be scattered due to evaporation or the like, since the size of the first extraction hole 33 is small, the scattered material stays within the first arc chamber 34 and thus is not introduced into the second arc chamber 35.

The first electrons introduced into the second arc chamber 35 are accelerated by a second arc voltage supplied between the second arc chamber 35 and the first extraction electrode 37 from a second arc power supply 45. The accelerated electrons collide with the gas introduced from the first arc chamber 34 so that dense second plasma is produced in the second arc chamber 35.

Since the plurality of permanent magnets 38 are arranged at the wall surfaces of the second arc chamber 35 to form the confinement magnetic fields, it is possible to suppress the loss of electrons at those wall surfaces and improve the plasma uniformity in the scan direction in the second arc chamber 35.

In order to keep the temperature of the permanent magnets 38 below their Curie temperature, i.e. prevent thermal demagnetization of the permanent magnets 38, the second arc chamber 35 is cooled by water cooling or the like. The second arc chamber 35 is provided with the second extraction hole 36 at the position facing a beam passing region. In this embodiment, as described before, the second extraction hole 36 is in the form of the plurality of holes arranged corresponding to the scan area SA of the beam. Alternatively, the second extraction hole 36 may be realized by an opening in the form of the single slit extending over the scan area SA, which has also been described before. The second arc chamber 35 is configured so as not to allow leakage of the gas from other than the second extraction hole 36, thereby preventing a reduction in gas pressure within the second arc chamber 35 to enhance the plasma production efficiency.

When the beam passes near the second extraction hole 36, second electrons are extracted from the second arc chamber 35 by the positive potential of the beam. The extracted second electrons collide with a neutral gas ejected from the second extraction hole 36 without ionization in the first and second arc chambers 34 and 35. As a result, plasma (plasma bridge) is formed between the beam (reciprocal swinging beam) and the second arc chamber 35 (precisely the second extraction hole 36). The second electrons in the second arc chamber 35 are autonomously supplied to the beam through the plasma bridge. Since the second extraction hole 36 exists in the region corresponding to the scan area SA, even when the position of the beam moves by deflecting for scanning, the plasma bridge is constantly formed between the beam and the second arc chamber 35 to thereby achieve the autonomous electron supply. The second arc chamber 35 is configured so as to be supplied with a second extraction voltage between itself and the ground potential from a second extraction power supply 46. With this configuration, it is possible to adjust the amount and energy of electrons supplied to the beam.

The current value (arc current) between the second arc power supply 45 and the second extraction power supply 46 may be measured and fed back so as to control the power supplies to achieve a constant arc current.

The second extraction hole 36 and the scan area by the beam thereabout are covered with the hollow cylindrical or rectangular member 40. The potential of the hollow cylindrical or rectangular member 40 may be set different from that of the second arc chamber 35 to enable an adjustment of the amount of second electrons extracted from the second arc chamber 35 and supplied to the wafer or may be set equal to that of the second arc chamber 35 to achieve a simple structure.

Inner walls 50 (surfaces in contact with the beam) of the hollow cylindrical or rectangular member 40 are formed serrated to thereby prevent adhesion of insulating stains to the whole surfaces of the inner walls. Further, on the beam upstream side of the hollow cylindrical or rectangular member 40 is disposed a bias electrode 48 that can be applied with a negative voltage from a bias power supply 47. This makes it possible to prevent scattering of electrons in the beam upstream direction and efficiently transport electrons toward the downstream side (toward the wafer). The hollow cylindrical or rectangular member 40 is further provided with magnetic shielding to thereby shield an external magnetic field, for example, a magnetic field from the deflecting energy filter 17. This is because when the external magnetic field is strong, electrons wind around the lines of magnetic field thereof so that the electrons are lost before reaching the wafer.

With the foregoing structure, the second extraction hole 36 exists in the region corresponding to the scan area SA. Accordingly, when the plasma is produced in the second arc chamber 35, even if the position of the beam moves by deflecting for scanning, the plasma bridge is constantly formed between the beam and the second arc chamber 35 to thereby carry out an equilibrium electron supply. In addition, since the confinement magnetic fields are generated inside the second arc chamber 35, the loss of electrons at the inner wall surfaces of the second arc chamber 35 is reduced. This makes it possible to improve the plasma production efficiency and uniformity of the plasma within the second arc chamber 35, thereby enabling a sufficient supply of electrons to the beam somewhat regardless of the scan position of the beam.

However, this plasma source arrangement relies on diffusion and does not warrant equal plasma properties of the plasma in the second arc chamber; it can also be relatively expensive, due to the use and arrangement of magnets and design details. Accordingly, it is desirable to provide charging prevention and improved uniform charge neutralization devices and methodologies by which uniform ion beams may be provided for implanting semiconductor workpieces that is less costly and difficult to fabricate.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The present invention is directed to methods and apparatus for implanting workpieces using an ion beam, by which the above mentioned and other shortcomings associated with the prior art may be overcome or mitigated. In particular, the invention provides implantation systems wherein a relatively wide ion beam, such as a ribbon beam or a pencil beam scanned into a time-averaged ribbon beam, is produced by an ion source, which is then charged neutralized.

According to one aspect of the invention, a plasma electron flood system, comprising a housing with a discharge chamber configured to contain a gas, and comprising an elongated extraction slit, a cathode and a plurality of anodes residing therein. The elongated extraction slit is in direct communication with an ion implantation system wherein the cathode emits electrons that are drawn to the plurality of anodes through a potential difference therebetween. A fraction of the emitted electrons are released through the elongated extraction slit as a band of electrons for use in neutralizing an ion beam traveling within the ion implantation system.

Another implementation of the invention involves an ion implantation system comprising an ion source that produces a relatively wide ion beam along a longitudinal path, a mass analyzer that provides a magnetic field across the path so as to deflect ions of the beam at varying trajectories according to mass. An end station receives the mass analyzed ion beam from the beamline system and supports at least one workpiece along the path for implantation using the mass analyzed ion beam. A discharge chamber within the housing comprises a plurality of anodes, a cathode and an elongated extraction slit and the cathode emits electrons that are drawn to the plurality of anodes through a potential difference between them. The elongated extraction slit emits a portion of the electrons as an elongated band into the ion beam.

Yet another aspect of the invention provides a method of introducing electrons into an ion beam, comprising energizing a cathode within a discharge chamber, biasing the cathode, a discharge chamber housing and an anode and emitting electrons through an elongated extraction slit into the ribbon ion beam.

Another aspect of the present invention provides a method of implanting a workpiece using a static or time-averaged ribbon ion beam in an ion implantation system, comprising creating a ribbon ion beam and mass analyzing the ribbon ion beam. The method further providing an elongated band of electrons to the ribbon ion beam and providing the mass analyzed ribbon ion beam to at least one workpiece so as to implant the at least one workpiece with ions from the ribbon ion beam.

In another implementation of the invention, involves an ion implantation system for implanting a workpiece using an ion beam, comprising means for creating a ribbon ion beam, means for mass analyzing the ribbon ion beam, means for providing an elongated band of electrons to the mass analyzed ribbon ion beam, means for providing the mass analyzed ribbon ion beam to a workpiece so as to implant the workpiece with ions from the ribbon ion beam.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
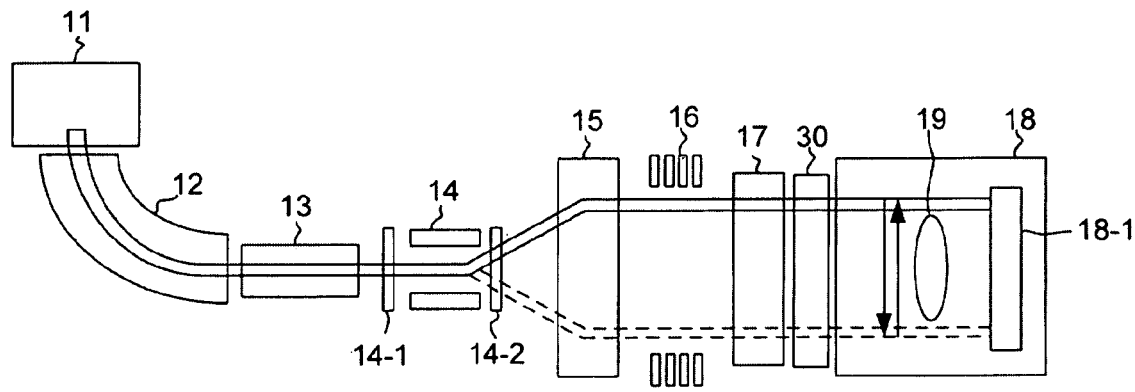
FIGS. 1 and 2 are a prior art plan view and a prior art side view, respectively, showing a schematic structure of an ion implantation system.

The present invention will now be described with reference to the drawings wherein like reference numerals are used to refer to like elements throughout. The invention provides methods and systems for provision of a plasma electron flooded ion beam for ion implantation of workpieces such as semiconductor workpieces. One implementation of the invention is illustrated and described hereinafter with respect to the drawing figures. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

Figure 8:
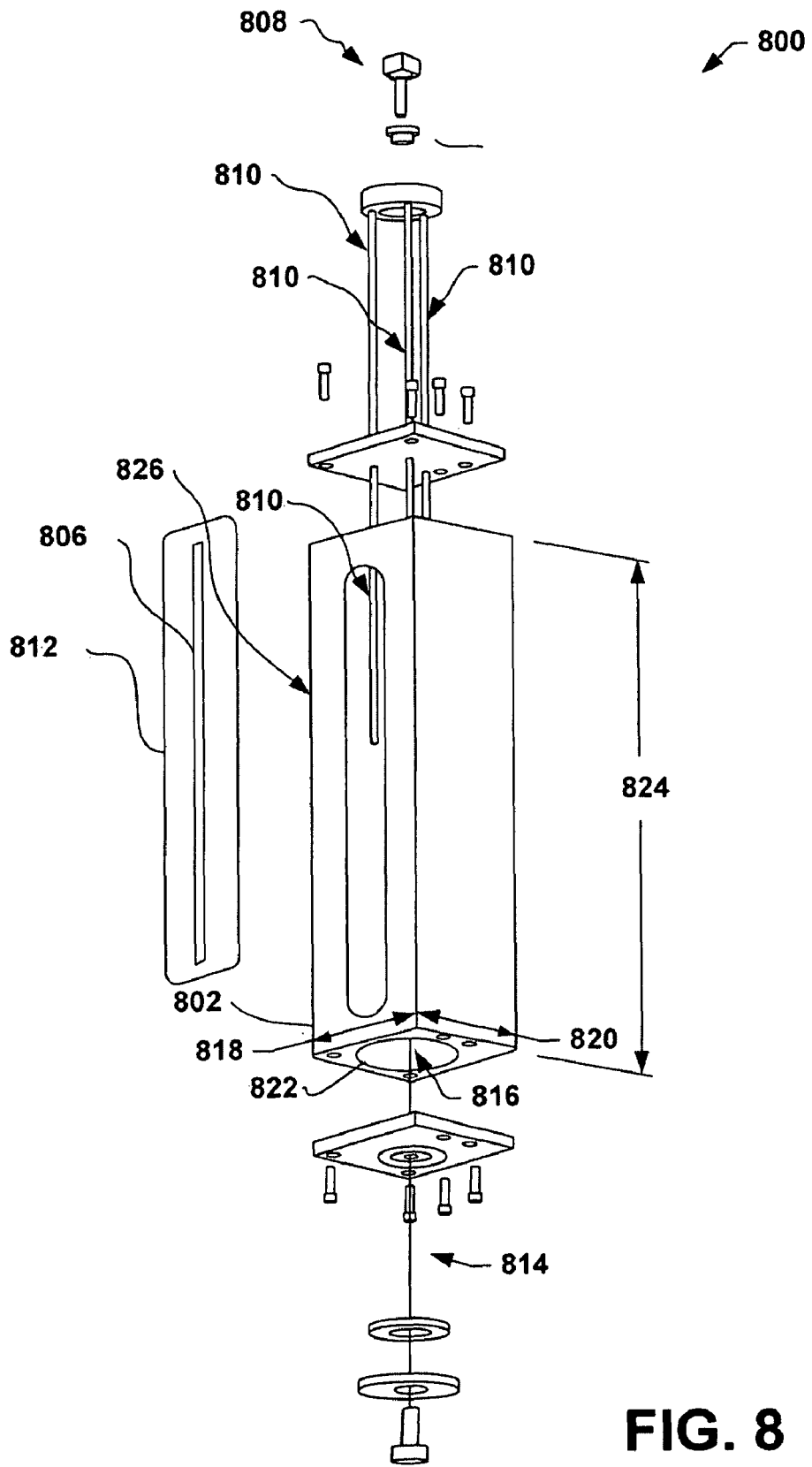
FIG. 8 is a partial perspective exploded view illustrating a plasma electron flood system (PEF) according to one aspect of the present invention.

Referring initially to FIG. 8 the figure illustrates an exploded partial view of the invention which provides a plasma electron flood system (PEF) 800 comprising a housing 802 configured to contain a gas introduced by e.g., a valve (not shown) within a discharge chamber 816. The housing 802 of the PEF system 800 has a cross-section of dimensions 818 by 820 with desired cutouts (e.g., inner diameter 822) that can be extruded to any desired extruded length 824, for example 300 or 450 millimeters. It should be appreciated that the housing 802 can also be machined, laser cut, and the like.

The plasma electron flood system 800 further comprises an elongated extraction slit 806, a cathode assembly 808, a plurality of anodes 810 and an elongated cathode filament 814, residing therein. In this embodiment, the elongated extraction slit 806 is formed within a slit plate 812 and the elongated extraction slit 806 can be in direct communication with an ion implanter (not shown). The cathode assembly 808 is energized to emit electrons from a cathode filament 814 that are drawn to the plurality of anodes through a potential difference therebetween. The electrons are released through the elongated extraction slit 806 as approximately an electron band for use in neutralizing a ribbon ion beam traveling within the ion implanter. The inventors recognized that by introducing electrons in this manner there would be an equal path length for electrons to reach a pencil, wide or ribbon ion beam in contrast to the unequal path length there is with point-source type technology, and that the charge neutralization would be more uniform across the width of the ion beam, for example.

To minimize contamination within the discharge chamber 816 and thus the ribbon ion beam, the cathode filament 814 and the plurality of anodes 810 can comprise graphite. It will be appreciated that tungsten (W), molybdenum (Mo), and tantalum (Ta) and other refractory materials commonly used in this technology can also be used.

Figure 9A:
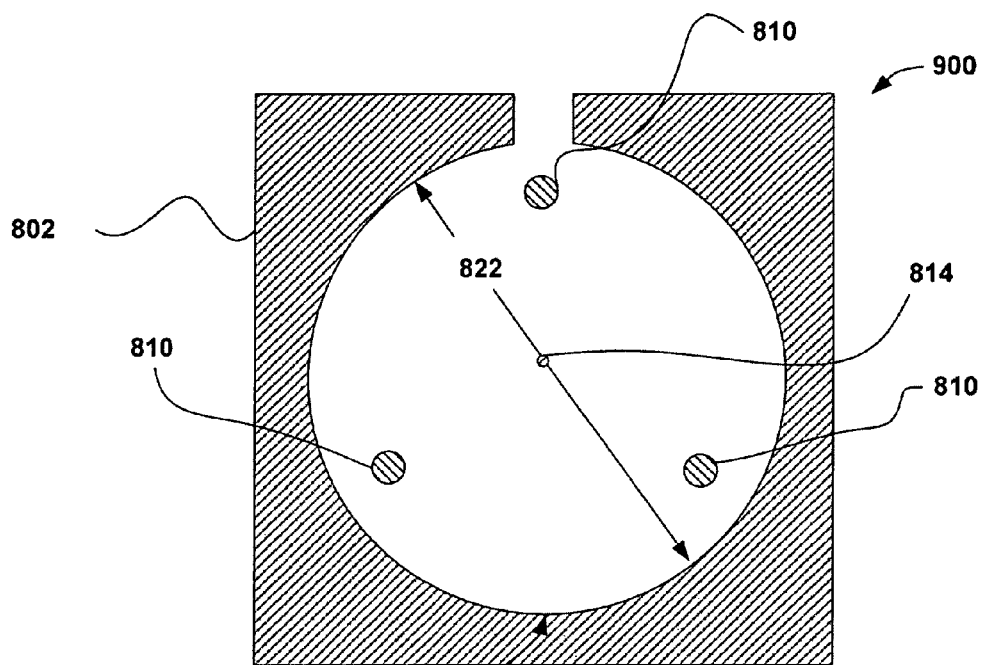
FIG. 9A is a cross-section through the housing illustrated in FIG. 8 according to yet another embodiment of the present invention.

In one embodiment, referring to FIGS. 8 and 9A, the plurality of anodes 810 (FIGS. 8 and 9A) are configured using reflex geometry, i.e., a relatively small anode area such that electrons accelerated toward the anodes 810 have a low probability of intercepting the anodes 810. The transit time of primary electrons from the cathode filament 814 to the anodes 810 is increased which enhances the numbers of electron-neutral collisions, thus the electron generation and the discharge density of the plasma, which lets the plasma electron flood system 800 operate at low pressures within the discharge chamber 816. The discharge chamber 816 can have a large diameter 822 (e.g., 100 mm or greater), wherein the cathode filament 814 has a diameter of 0.9 mm, for example. The cathode filament 814 current can be set at 40 A, with a resultant cathode filament 814 temperature of approximately 2500° C. and a relatively low self-magnetization (e.g., less than 100 Gauss). There can be three anodes 810, for example, each having a diameter of 3 mm and therefore the anodes 110 are small enough in diameter to create a reflex geometry and yet large enough to ensure plasma discharge stability. The gas comprises Xenon, for example, and operates at about $5 \times 10^{-5}$ to $1 \times 10^{-4}$ Torr partial pressure within the discharge chamber 116 of the plasma electron flood system 100. Alternatively to Xenon the gas can also comprise Argon. With the cathode 810 at the same electrostatic potential as the housing 102, for example, the primary electrons are confined electrostatically, which in turn increases both the plasma confinement and thus plasma density.

The plasma electron flood system 800 can operate as a DC discharge at low pressures in a Townsend discharge mode, wherein electrons are injected from the cathode filament 814 in order to sustain the ongoing discharge. Thereby the pressure of the Xenon gas can be kept low (e.g., less than 5e-5 Torr), for example, which can reduce the partial pressure of Xenon in the system and can minimize some the detrimental effects of charge exchange the ion beams experience at higher pressures (e.g., greater than 5e-6 Torr). Biasing the anodes 810 electrically positive and electrically grounding the cathode filament 814 and housing 802 provides electron energy filtering so that only collisional or thermalized electrons can leave the discharge chamber 816 through the elongated extraction slit opening 806, for example.

Figure 9B:
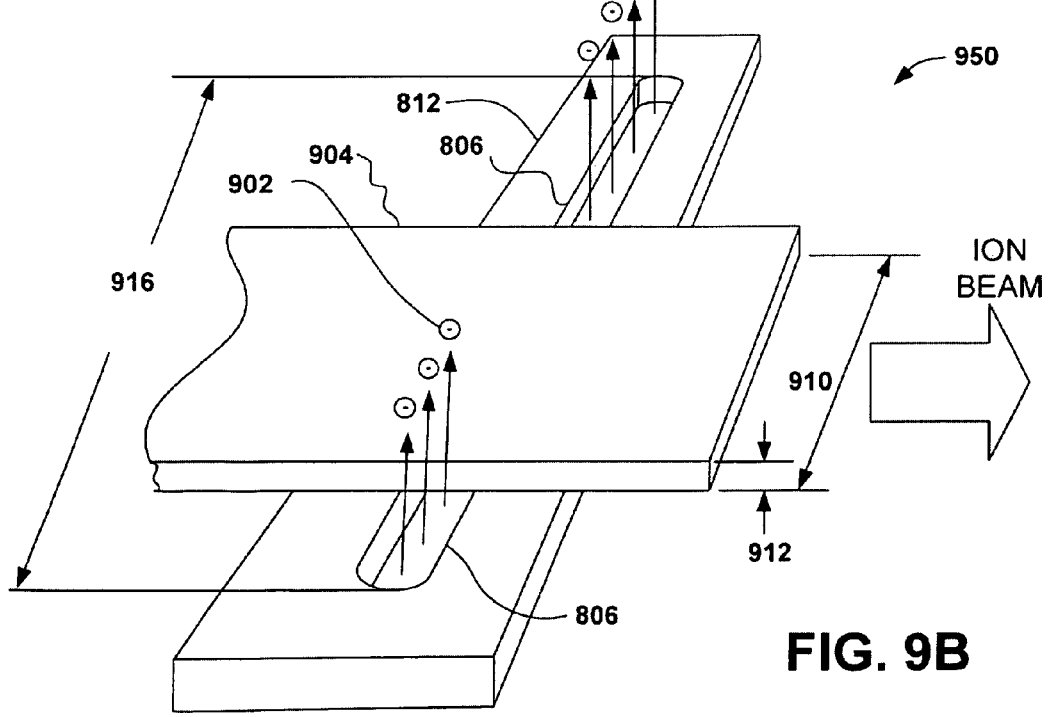
FIG. 9B is a partial perspective view further illustrating the flow of electrons through the elongated extraction slit of FIG. 8 into a ribbon ion beam according to another aspect of the present invention.

Referring now to FIG. 9B (not drawn to scale), the housing 802 (FIG. 1) can be configured so that an electron elongated extraction slit 806 is transverse to the direction of propagation of an ion beam 802, for example as illustrated, such that the elongated band of extracted electrons is provided into the ribbon ion beam transverse to the length of the ribbon ion beam, as illustrated in FIG. 9B. This ensures uniformity of charge neutralization, allowing electrons 902 to exit from the plasma electron flood system (PEF) 950 all along the elongated extraction slit 806 in a slit plate 812. It should be appreciated that the elongated extraction slit 806 in the slit plate 812 can be an integral part of the PEF 900 (FIG. 9) rather than as illustrated, for example. The length of the slit 916 can be made to match the width 910 of the ribbon ion beam 904, for example to aid ion beam uniformity. In addition, the length of the slit 916 can be made automatically adjustable, based upon the wafer size, utilizing masking or other techniques that are well known by those of skill in the art, for example.

Figure 10:
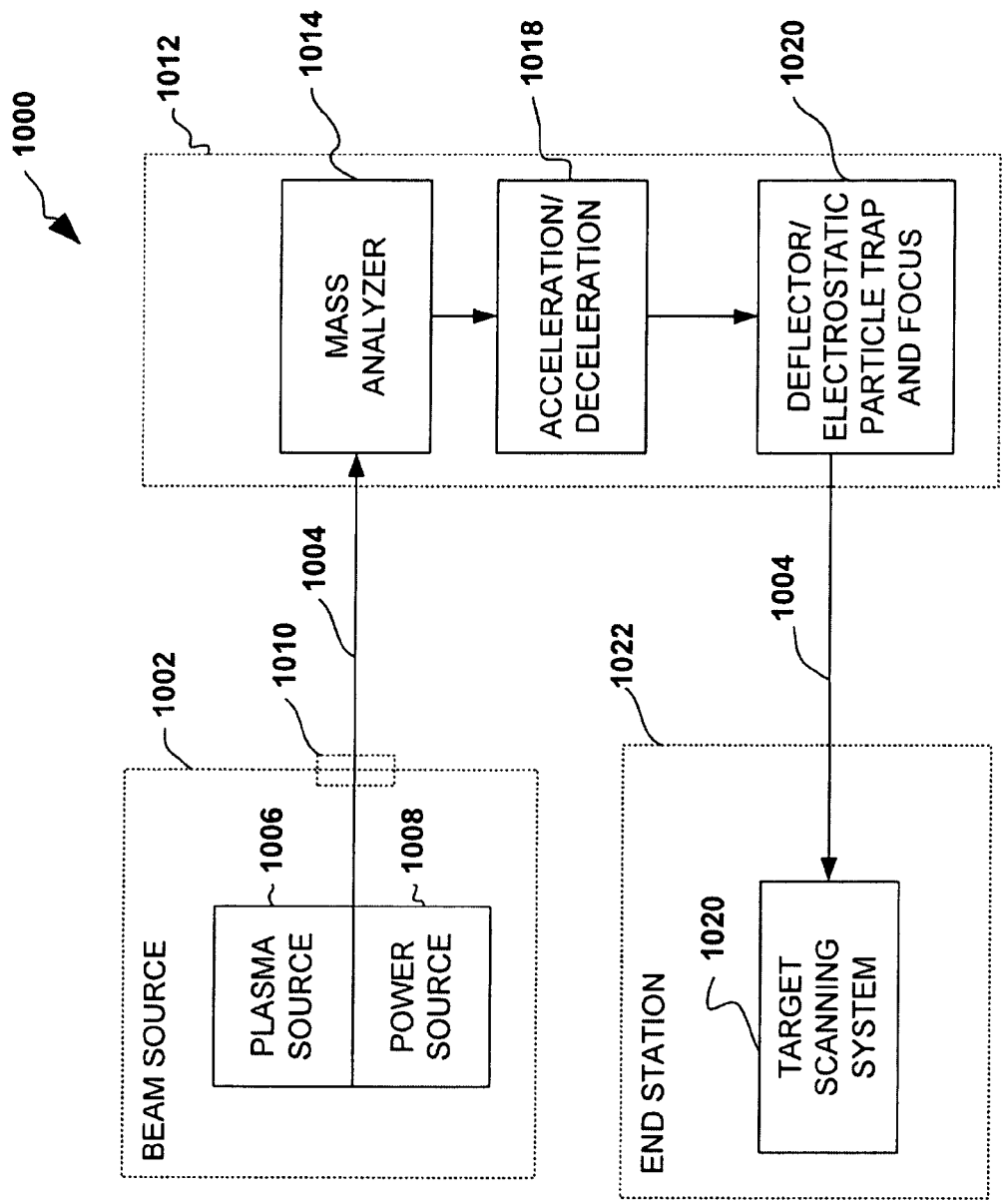
FIG. 10 is a schematic view further illustrating a method involving another use of the present invention.

Referring to FIG. 10, the invention provides an ion implantation system 1000 comprising an ion source 1002 for producing an elongated (e.g., a pencil ion beam, a ribbon-shaped, etc.) ion beam 1004 along a longitudinal beam path. The ion beam source 1002 includes a plasma source 1006 with an associated power source 1008 and an extraction apparatus 1010, which may be of any design by which the elongated ribbon ion beam 1004 of large aspect ratio is extracted, for example. The following examples are provided to more fully illustrate the invention, but are not to be construed as limiting the scope thereof. For instance, the plasma source 1006 may comprise a relatively long plasma confinement chamber from which the ribbon-beam 1004 can be extracted using a high aspect ratio extraction slit in the extraction apparatus 1010. The ribbon-beam 1004 comprises a transverse width and a transverse height defining a first aspect ratio, wherein the transverse width is much larger than the transverse height. For example, the width of the elongated ion beam 1004 extracted from the plasma source 1006 can be approximately 400 mm, for example and the height can be 10 mm, for example. The formation of ribbon ion beams and other type ion beams is well known by those of ordinary skill in the art.

A beamline system 1012 is provided downstream of the ion source 1002 to receive the beam 1004 therefrom, comprising a mass analyzer 1014 positioned along the path to receive the beam 1004. The mass analyzer 1014 operates to provide a magnetic field across the path so as to deflect ions from the ion beam 1004 at varying trajectories according to mass (e.g., charge to mass ratio) in order to provide an elongated mass analyzed ion beam 1004 having a second aspect ratio and profile substantially similar to the first aspect ratio. An end station 1022 is provided in the system 1000, which receives the mass analyzed ion beam 1004 from the beamline system 1012 and supports one or more workpieces such as semiconductor workpieces along the path for implantation using the mass analyzed ion beam 1004. The end station 1022 includes a target scanning system 1020 for translating or scanning one or more target workpieces and the elongated ion beam 1004 relative to one another. The target scanning system 1020 may provide for batch or serial implantation.

Figure 11:
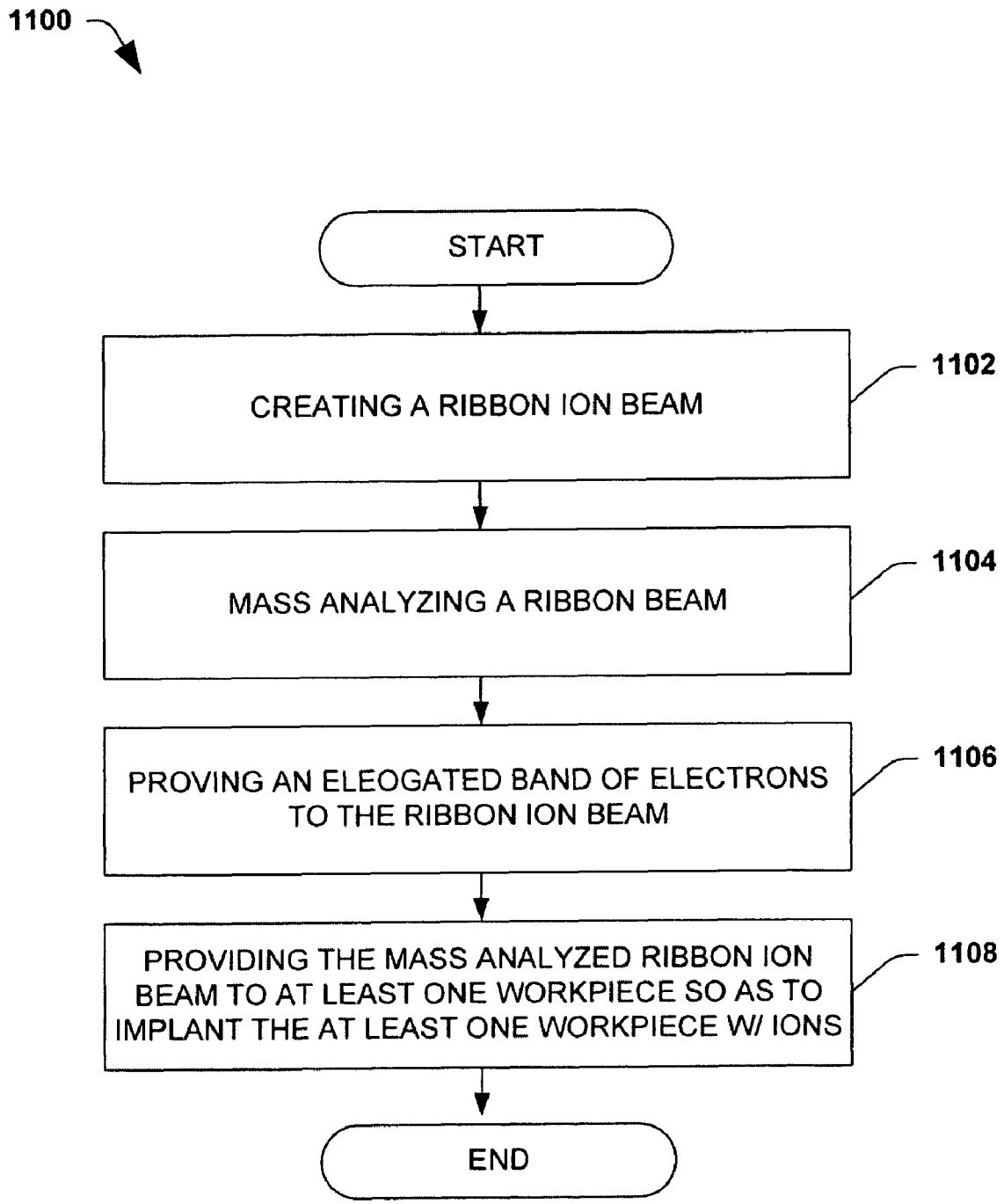
FIG. 11 is a block diagram illustrating another method of the present invention.

In accordance with another aspect of the present invention, FIG. 11 illustrates an exemplary method 1100 for transferring a plurality of electrons created within a plasma chamber into a ribbon ion beam associated with a plasma flood electron system 100 (FIG. 1). The system 100 illustrated in FIG. 1, for example, can be operated in accordance with the method 1100 of FIG. 11. It is noted that acts performed within the plasma flood electron system 100 (FIG. 1) can be performed concurrently (in parallel) or in series. It should also be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the system 100 illustrated and described herein as well as in association with other systems not illustrated.

As illustrated in FIG. 11, the method 1100 begins at 1102 a ribbon ion beam is created using techniques that are well known by those of skill in the art. The invention provides an ion source 1002 (FIG. 10) for producing an elongated (e.g., a ribbon-shaped, etc.) ion beam 1004 (FIG. 10) along a longitudinal beam path. The ion beam source 1002 (FIG. 10) includes a plasma source 1006 (FIG. 10) with an associated power source 1008 (FIG. 10) and extraction apparatus 1010 (FIG. 10), which may be of any design by which the elongated ribbon ion beam 1004 of large aspect ratio is extracted, for example. As discussed supra, the following examples are provided to more completely illustrate the invention, but are not to be construed as limiting the scope thereof. For instance, the plasma source 1006 may comprise a relatively long plasma confinement chamber from which the ribbon ion beam 1004 can be extracted using a high aspect ratio extraction slit in the extraction apparatus 1010. The ribbon-beam 1004 comprises a transverse width and a transverse height defining a first aspect ratio, wherein the transverse width is much larger than the transverse height. For example, the width of the elongated ion beam 1004 extracted from the plasma source 1006 can be approximately 400 mm, for example and the height can be 10 mm, for example.

At 1104 the ribbon beam is mass analyzed to select ions of a desired charge-to-mass ratio. The mass analysis apparatus for mass resolving the ion beam uses magnetic fields. The mass of an ion relative to the charge thereon (e.g., charge-to-mass ratio) affects the degree to which the ions are accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The mass analyzer can employ a mass analysis magnet(s) creating a dipole magnetic field to deflect various ions in an ion beam via magnetic deflection in an arcuate passageway that will effectively separate ions of different charge-to-mass ratios. Mass analysis techniques are well known by those of skill in the art.

Continuing at 1106 a cathode and a plurality of anodes within the discharge chamber of the plasma flood electron system 800 (FIG. 8) are energized. The cathode 810 current can be set at 40 A, with a resultant cathode 810 temperature of approximately 2500° C. and a relatively low self-magnetization (e.g., less than 100 Gauss). The plurality of anodes 810 (e.g., three) can each of the anodes having a diameter of 3 mm, for example. The gas within the plasma chamber 816 can comprise Xenon, for example, and can operate at about $5 \times 10^{-5}$ to $1 \times 10^{-4}$ Torr within the plasma chamber 116 (FIG. 1) of the plasma electron flood system 800 (FIG. 8).

Figure 2:
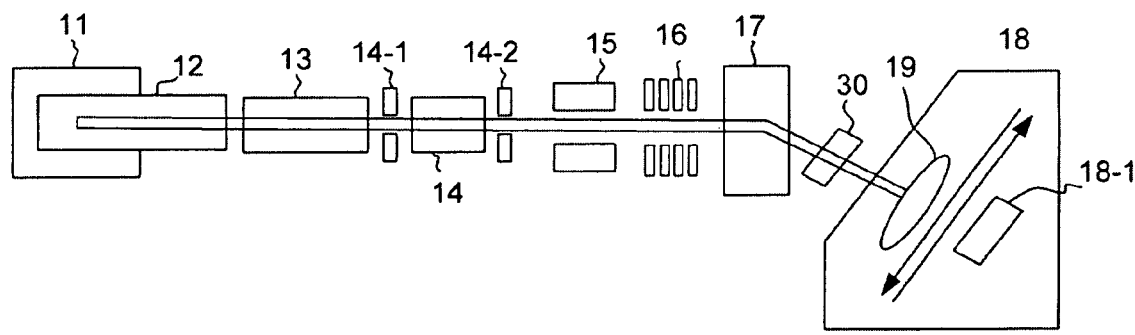
Figure 3:
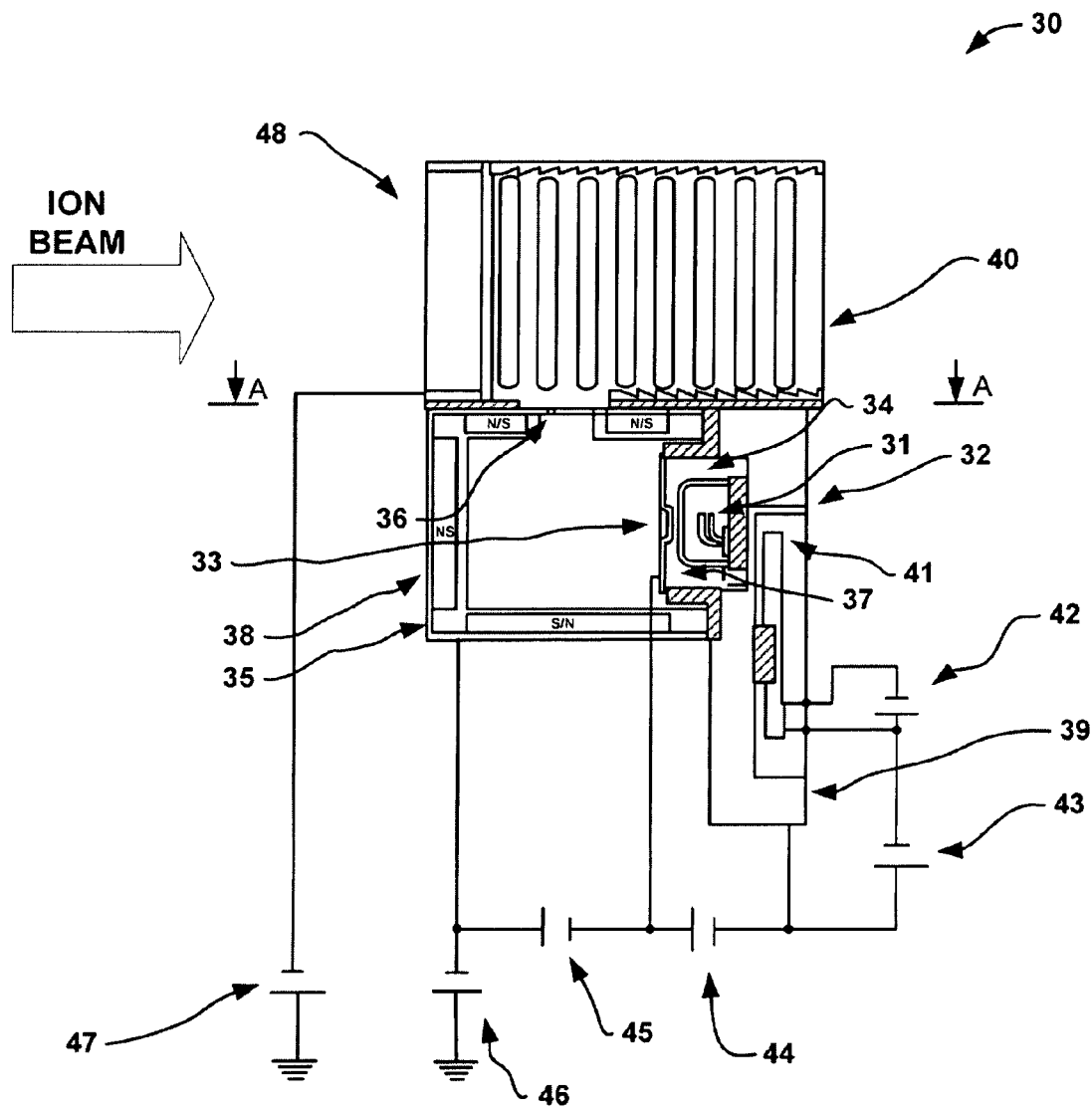
FIG. 3 is a prior art vertical sectional view for explaining a structure of a charge compensation device.
Figure 4A:
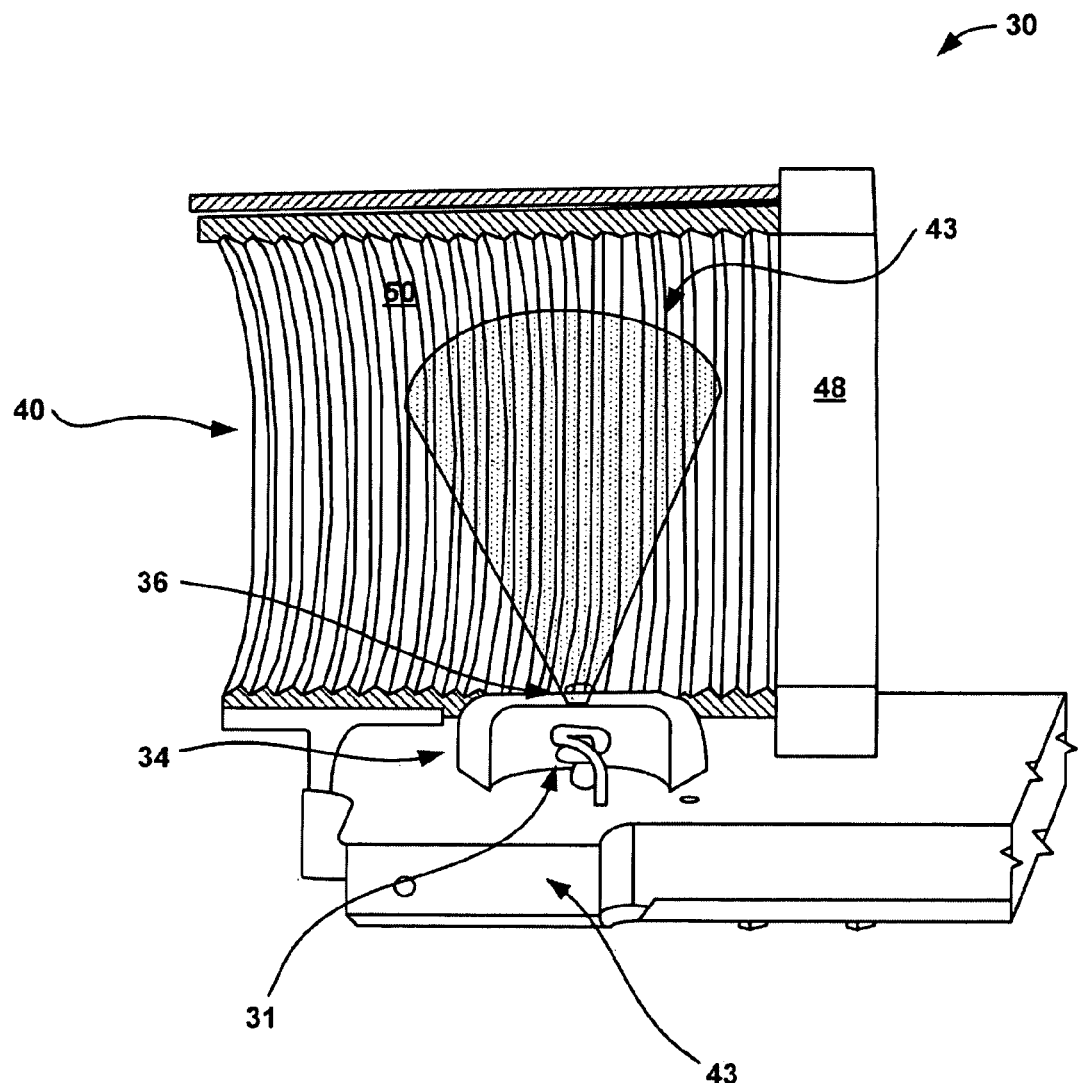
FIG. 4A is a prior art cross-sectional perspective view of the device illustrated in FIG. 3.
Figure 4B:
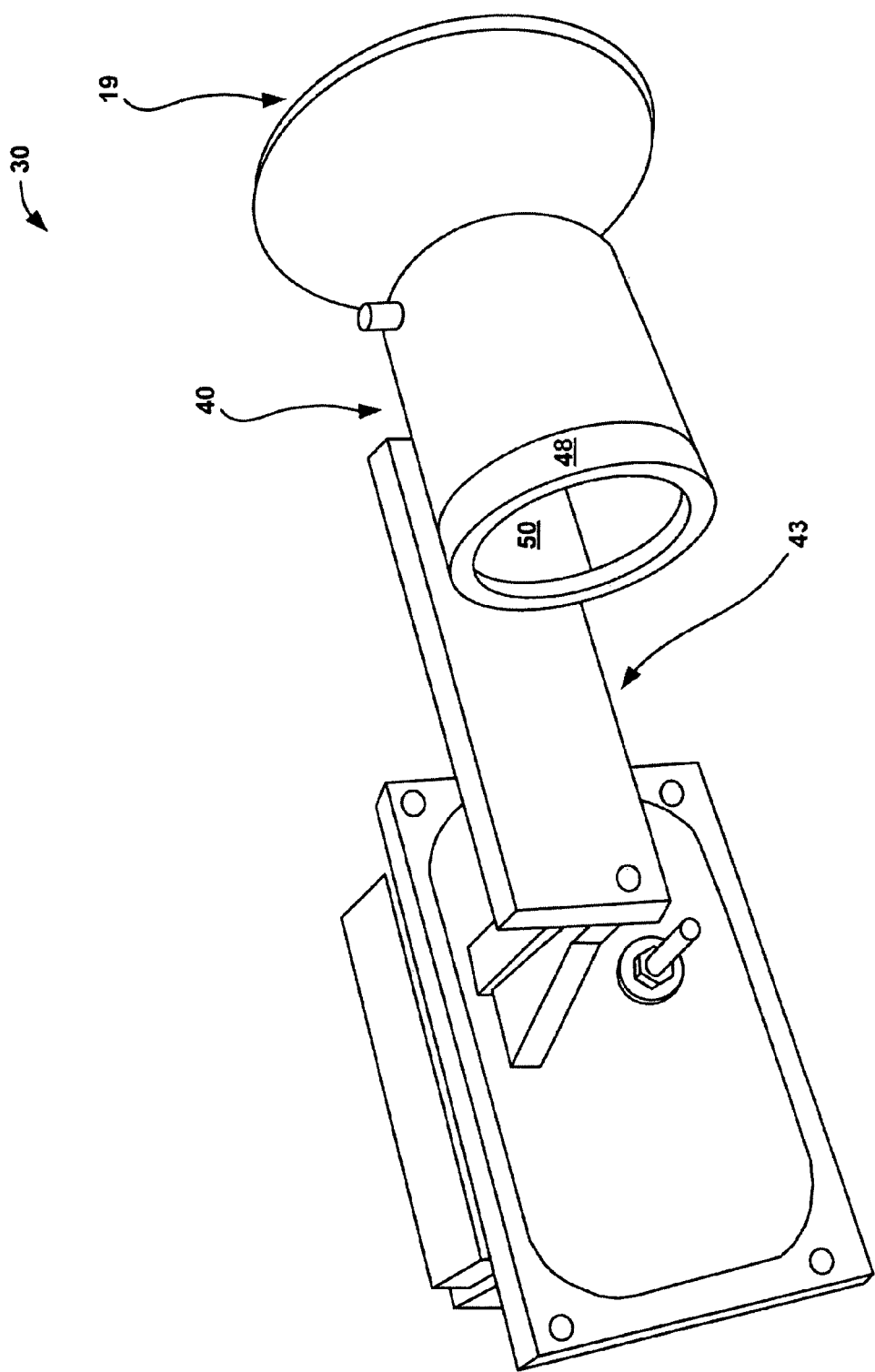
FIG. 4B is a prior art partial perspective view of the device illustrated in FIG. 3.
Figure 5:
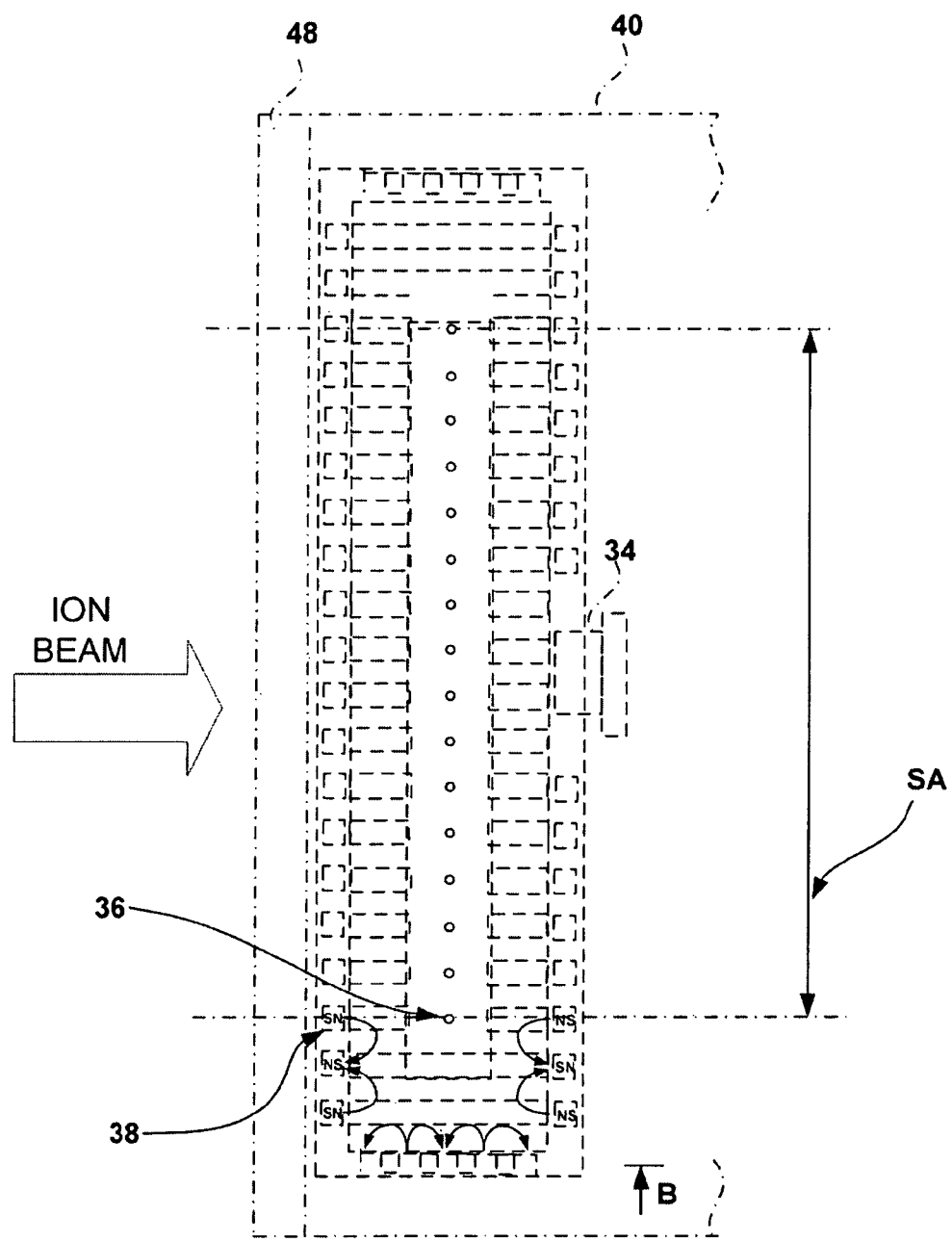
FIG. 5 is a prior diagram showing an arrangement of confinement magnetic field forming permanent magnets at one of both end surfaces of a second arc chamber shown in FIG. 3.
Figure 6:
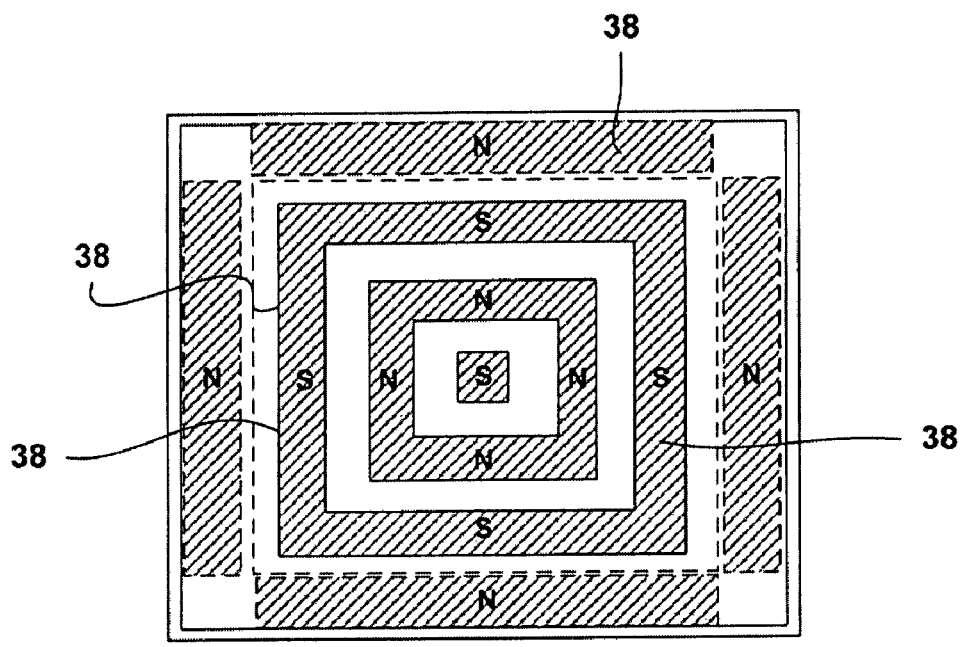
FIG. 6 is a prior art diagram showing an arrangement of confinement magnetic field forming permanent magnets at one of both end surfaces of a second arc chamber shown in FIG. 5.
Figure 7:
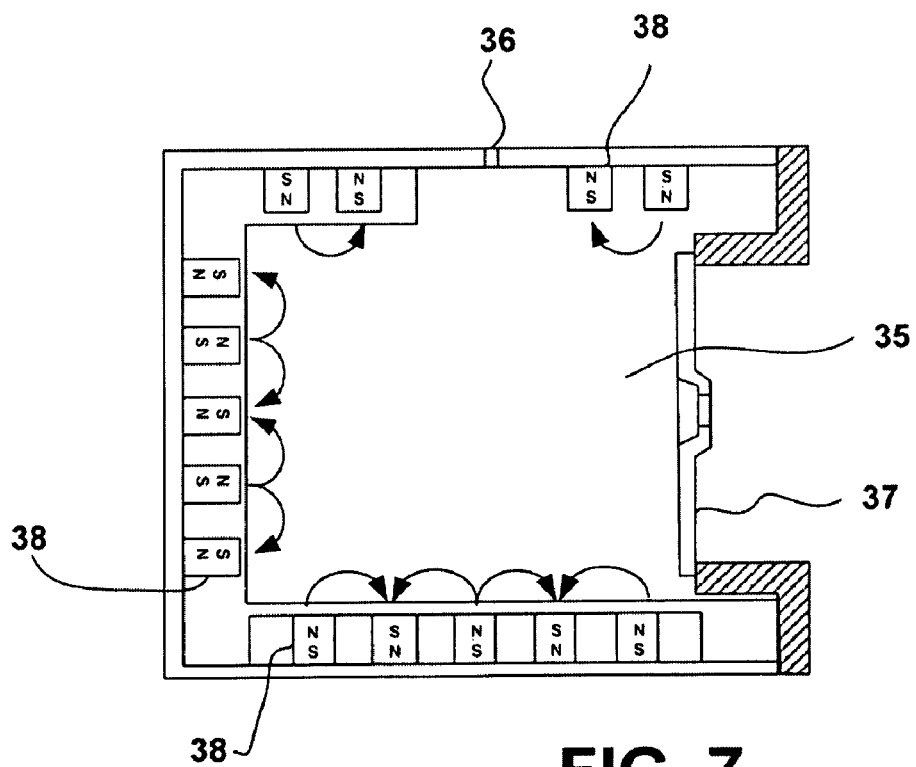
FIG. 7 is a prior art diagram showing another arrangement of confinement magnetic field forming permanent magnets at upper, lower, left, and right wall surfaces of the second arc chamber shown in FIG. 3.

Components 810, 802 and 814 can be biased electrostatically to provide electrostatic confinement of the discharge plasma and energy filtering of the electrons leaving through the extraction slit 806; for example, the cathode 810 (FIG. 8) and the discharge chamber housing 802 can be biased to ground potential and the anodes 810 (FIG. 1) can be biased to 100 Volts. An electron leaving the cathode 810 (FIG. 8) will have close to zero (0) electron-Volts initial kinetic energy, when it reaches the anode 110 (FIG. 1) it will have gained 100 electron-Volts of kinetic energy (100 eV). If the electron collides with an atom on the path to the anode, it can acquire at most a kinetic energy of 100 eV plus the energy of the atom, for example 1 eV; and therefore will have a total maximum energy of 101 eV. Such an electron or any electron acquiring a total energy larger than 100 eV could leave the discharge chamber through the extraction slit, loosing 100 eV of energy and leaving with typically 1 eV of kinetic energy, for example. At 1106 numerous such electrons, typically referred to as collisional, thermalized or secondary electrons are delivered in this manner into the ribbon ion beam 202 (FIG. 2). The collisional electrons are particularly useful to neutralize the ion beam 202 prior to implantation in a workpiece. Thus electrons created within the discharge chamber can be introduced into the ribbon ion beam as an elongated band of electrons passing through the elongated slit.

As both anode and cathode can be subject to sputtering and evaporation the cathode filament 814 can comprise graphite, and both tungsten (W), molybdenum (MO), and tantalum (Ta) are optional materials, for example. Thereby the risk of wafer contamination from cathode material can be minimized. The anodes 810 can comprise graphite, or aluminum (Al), both materials with little contamination risk to silicon wafer, or molybdenum (Mo), and tungsten (W), and the like.

At 1108 the mass analyzed ribbon ion beam is provided to at least one workpiece so as to implant the at least one workpiece w/ions, wherein the method ends.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising".

What is claimed is:

1. A plasma electron flood system, comprising:
a housing with a discharge chamber configured to contain a gas, and comprising an elongated extraction slit, a cathode filament extending along a majority of the elongated extraction slit, a cathode assembly and a plurality of anodes residing therein; and
wherein the elongated extraction slit is in direct communication with an ion implantation system;
wherein the cathode filament emits electrons that are drawn to the plurality of anodes through a potential difference therebetween;
wherein a portion of the electrons are extracted through the elongated extraction slit as an electron band for use in neutralizing an ion beam traveling within the ion implantation system, and
wherein the discharge chamber is cylindrical and has an internal diameter of about 30 to 200 millimeters.

2. The plasma electron flood system of claim 1, wherein the cathode filament diameter is about 0.5 to 2 millimeters;
wherein the cathode filament has a length of 240 to 500 millimeters;
wherein each of the anode diameters is about 1 to 10 millimeters; and
wherein each of the anodes has a length of 240 to 500 millimeters.

3. The plasma electron flood system of claim 1,
wherein the discharge chamber has a length of 240 to 500 millimeters; and
wherein the extraction slit is about 1 to 50 millimeters wide and about 200 to 450 millimeters long.

4. The plasma electron flood system of claim 1, wherein the cathode filament is fabricated of a material comprising: graphite, tungsten, molybdenum or tantalum; and
wherein the plurality of anodes are fabricated of a material comprising: graphite, aluminum, tungsten or molybdenum.

5. The plasma electron flood system of claim 1,
wherein the gas within the discharge chamber comprises a xenon gas having a partial pressure of is about $5\times10^{-5}$ to $1\times10^{-4}$ Torr, an argon gas, or a mixture of xenon and argon gases.

6. A method of introducing electrons into a ribbon ion beam, comprising:
energizing a cathode filament within a discharge chamber comprising an elongated extraction slit, a cathode assembly, a cathode filament extending along a majority of the elongated extraction slit, and an anode;
biasing the cathode, a discharge chamber housing and the anode; and
emitting electrons through the elongated extraction slit into the ribbon ion beam,
wherein a cathode current is about 40 amps;
wherein the cathode and discharge chamber housing is between −20 and 20 volts with respect to the surroundings; and
wherein the anode voltage is between 30 and 100 volts.

7. The method of claim 6,
wherein a pressure within the discharge chamber is about $5\times10^{-5}$ to $1\times10^{-4}$ Torr; and
wherein the gas comprises xenon, and argon.

8. The method of claim 6, wherein the method operates in a Townsend discharge mode.

9. A method of implanting a workpiece using a ribbon ion beam in an ion implantation system, comprising:
creating a ribbon ion beam;
mass analyzing the ribbon ion beam;
providing an elongated band of electrons, from a housing with a discharge chamber configured to contain a gas, and comprising an elongated extraction slit, a cathode assembly, a cathode filament extending along a majority of the elongated extraction slit, and a plurality of anodes residing therein, to the ribbon ion beam; and
providing the mass analyzed ribbon ion beam to at least one workpiece so as to implant the at least one workpiece with ions from the ribbon ion beam,
wherein the wherein a cathode current is about 40 amps,
wherein the cathode and discharge chamber housing are set to zero volts, and
wherein the anode voltage is set to 100 volts.

10. The method of claim 9,
wherein the elongated extraction slit is in direct communication with the ion implantation system;
wherein the cathode filament emits electrons that are drawn to the plurality of anodes through a potential difference therebetween;
wherein the elongated band of electrons are discharged through the elongated extraction slit for use in neutralizing the ribbon ion beam traveling within the ion implantation system.

11. The method of claim 10, wherein the cathode voltage and the discharge chamber housing voltage are biased to a lower voltage than the anode voltage;
wherein a pressure within the discharge chamber is about $5\times10^{-5}$ to $1\times10^{-4}$ Torr; and
wherein the gas comprises xenon;
wherein the system operates in a Townsend discharge mode.

12. A plasma electron flood system, comprising:
a housing with a discharge chamber configured to contain a gas, and comprising an elongated extraction slit, a cathode filament extending along a majority of the elongated extraction slit, a cathode assembly and a plurality of anodes residing therein; and
wherein the elongated extraction slit is in direct communication with an ion implantation system;
wherein the cathode filament emits electrons that are drawn to the plurality of anodes through a potential difference therebetween;
wherein a portion of the electrons are extracted through the elongated extraction slit as an electron band for use in neutralizing an ion beam traveling within the ion implantation system, and
wherein the housing does not comprise magnets configured to spatially confine the electrons.

* * * * *